(12) United States Patent
Bi et al.

(10) Patent No.: US 8,748,728 B2
(45) Date of Patent: *Jun. 10, 2014

(54) THIN-FILM SOLAR CELL MODULE AND A MANUFACTURING METHOD THEREOF

(75) Inventors: Chien-Chung Bi, Houli Township, Taichung County (TW); Chia-Yu Chen, Houli Township, Taichung County (TW)

(73) Assignee: Nexpower Technology Corp., Taichung County (TW)

( * ) Notice: Subject to any disclaimer, the term of this patent is extended or adjusted under 35 U.S.C. 154(b) by 395 days.

This patent is subject to a terminal disclaimer.

(21) Appl. No.: 12/852,629

(22) Filed: Aug. 9, 2010

(65) Prior Publication Data

US 2011/0036392 A1    Feb. 17, 2011

(30) Foreign Application Priority Data

Aug. 14, 2009   (TW) ................................ 98127441 A

(51) Int. Cl.
*H01L 31/042*   (2014.01)
*H02N 6/00*    (2006.01)
*H01L 31/00*   (2006.01)
*H01L 27/142*  (2014.01)

(52) U.S. Cl.
CPC ................................. *H01L 27/1426* (2013.01)
USPC .......................................... 136/244; 136/255

(58) Field of Classification Search
CPC ............ H01L 27/1422; H01L 27/1423; H01L 27/1425; H01L 27/1426; H01L 31/0201
USPC .......................................... 136/255, 256, 244
See application file for complete search history.

(56) References Cited

U.S. PATENT DOCUMENTS

| | | | |
|---|---|---|---|
| 4,127,738 A * | 11/1978 | Ghosh et al. ................... | 136/255 |
| 4,153,907 A * | 5/1979 | Kofron .......................... | 257/461 |
| 4,749,454 A * | 6/1988 | Arya et al. ..................... | 205/656 |
| 4,769,086 A * | 9/1988 | Tanner et al. .................. | 136/249 |
| 6,265,652 B1 * | 7/2001 | Kurata et al. .................. | 136/244 |
| 6,288,326 B1 | 9/2001 | Hayashi et al. | |
| 6,357,649 B1 | 3/2002 | Okatsu et al. | |
| 6,380,025 B1 | 4/2002 | Suzuki et al. | |
| 6,469,242 B1 | 10/2002 | Kondo | |
| 6,784,361 B2 * | 8/2004 | Carlson et al. ................ | 136/258 |
| 2011/0155219 A1 * | 6/2011 | Ma et al. ....................... | 136/249 |

* cited by examiner

*Primary Examiner* — Eli Mekhlin
(74) *Attorney, Agent, or Firm* — Ming Chow; Sinorica, LLC

(57) ABSTRACT

Disclosed are a thin film solar cell module and a manufacturing method thereof. The thin film solar cell comprises, from bottom to top, a first substrate, a first electrode, an absorber layer, and a second electrode layer. A current output region with a current output element disposed therein is formed at the thin film solar cell module. The absorber layer in the current output region is removed through a mask, thereby making the first electrode layer contacts directly there with the second electrode layer. The current output region can be formed at the positive electrode, the negative electrode, or both positive electrode and negative electrode simultaneously, of the thin film solar cell module, thereby increasing the contact area between the first electrode layer and the second electrode layer at the positive electrode and the negative electrode. The useless current, the resistance and the heat generated there are reduced.

8 Claims, 3 Drawing Sheets

THIN-FILM SOLAR CELL MODULE AND A MANUFACTURING METHOD THEREOF

BACKGROUND OF THE INVENTION

1. Field of the Invention

The present invention relates to a solar cell, more particularly relating to a thin-film solar cell and the manufacturing method thereof that make the front electrode layer and the back electrode layer at the positive electrode or the negative electrode contact directly with each other.

2. Description of the Prior Art

A solar cell is a photovoltaic semiconductor device that directly converts the energy of the sunlight into electricity and outputs a current with a voltage by the photoelectric effect. Therefore, a solar cell is also called as a photovoltaic (PV) cell. A solar cell can be classified as a silicon-based solar cell, a thin film solar cell, a dye-sensitized solar cell, or an organic/polymer solar cell according to the categories of the light-absorbing material used in the solar cell, wherein the light-absorbing material used in the organic/polymer solar cell are III-V compounds, including GaAs, InP and InGaP, and II-VI compounds, including CdTe and $CuInSe_2$.

A solar cell mainly comprises a substrate, a front electrode layer, an absorber layer and a back electrode layer. The absorber layer can uptake incident light to generate electron-hole pairs by photovoltaic effect. Electrons and holes move toward opposing directions respectively by the intrinsic electric field built in the absorber layer. A voltage difference is therefore generated between the positive electrode and the negative electrode of the solar cell. To output a current generated between the two electrodes of the solar cell, a solder bump is disposed on each of the two electrodes. The current is therefore output from the two electrode layers via the electrical connection provided by the solder bump.

Generally, the solder bumps are extended from the back electrode layer downward by means of ultrasonic waves or vibration to contact the front electrode layer. However, in the course of setting the solder bumps, due to the poor controllability of such means in respect of output power, the resultant solder bumps are often not well located as expected, and defects such as poor contact caused by the solder bumps not deep enough to contact the front electrode layer or unsightly substrate induced by the solder bumps excessively deep to become jutting out of the substrate can happen. Moreover, the current generated by the positive electrode of the solar cell at the solder bump cannot be output via the solder bump. Therefore, the current generated there is a useless current for it cannot be utilized effectively. If the absorber there continuously generates current via photovoltaic effect, accumulation of the useless current is therefore resulted in the heat generation there and the elevation of temperature. In addition, a reverse current will be caused by the electrically serial- or parallel-contact of the positive electrode and other general electronics. The reverse current, when encounters the absorber layer that functions as an electrical resistance to it, will generate heat and temperature there will be elevated. Therefore, a conventional solar cell usually has the problem of temperature being elevated at the solder bump. If the temperature there is elevated above a threshold, the normal function of the elements of a solar cell will be effected, or even out of function. On the other hand, at the negative electrode of a conventional solar cell, the front electrode layer electrically contacts to the back electrode layer via only the solder bump there, which results a small contact area between the two electrode layers and limits the amount of the electrical current.

SUMMARY OF THE INVENTION

In order to overcome the shortcomings of the poor controllability of disposition of the solder bumps, high temperature resulted from the heat generated at the positive electrode of a solar cell, as well as the limited electrical current resulted from the small contact of the front and back electrode layers at the negative electrode mentioned previously, the present invention provides a thin film solar cell module capable of increasing the contact between the front and the back electrode layers, wherein the thin film solar cell module uses a mask to inhibit the absorber layer in the current output region at the positive electrode or the negative electrode from outputting current, thereby making the front and the back electrode layers at the said current output region electrically and directly contact with each other and reducing the useless current and resistance generated at the positive electrode. The heat generated there is therefore reduced to prevent the elevation of the temperature.

The primary object of the present invention is to provide a thin film solar cell module. The thin film solar cell module comprises a substrate, a first electrode layer formed on the substrate, an absorber layer formed on the first electrode layer, wherein a current output region is reserved in the side edge of the absorber layer, and a second electrode layer disposed on the absorber layer. The current output region can be formed at the positive electrode, the negative electrode, or both the positive electrode and the negative electrode simultaneously, of the thin film solar cell module. A current output element, such as a soldering tin, is disposed in the current output region for outputting a current produced from the absorber layer, wherein the first electrode layer at the current output region electrically and directly contacts with the second electrode layer at the current output region so as to increase the contact area between the first electrode layer and the second electrode layer. Therefore, the useless current and resistance are reduced. The heat generated there is also reduced.

Another object of the present invention is to provide a manufacturing method of a thin film solar cell module, comprising the following steps. (1) Providing a substrate. (2) Forming a first electrode layer on the substrate. (3) Forming an absorber layer on the first electrode layer, wherein a current output region is reserved in the side edge of the absorber layer. (4) Forming a second electrode layer on the absorber layer, and making the first electrode layer at the current output region electrically and directly contact with the second electrode layer. Furthermore, the manufacturing method of a thin film solar cell module further comprises the steps of covering the first electrode layer at the current output region with a mask. Moreover, the manufacturing method of a thin film solar cell module further comprises the steps of disposing a current output element, such as a solder tin, at the current output region to output a current produced from the absorber layer, wherein the current output region can be formed at the positive electrode, the negative electrode, or both the positive electrode and the negative electrode simultaneously, of the thin film solar cell module. In addition, the first electrode layer at the current output region electrically and directly contacts with the second electrode layer at the current output region. Therefore, the useless current and resistance are reduced. The heat generated there is also reduced.

Furthermore, the material of the substrate may be soda-lime glass, low iron glass, or alkali-free glass. The material of the absorber layer may be amorphous silicon, polymorphous silicon, microcrystalline silicon (mc-Si) and microcrystalline silicon germanium (mc-SiGe). The material of the first electrode layer may be a transparent conductive oxide. The material of the second electrode layer may be a transparent conductive oxide (TCO), a metal and a metal-transparent-conductive-oxide complex. The transparent conductive oxide may be indium doped tin oxide (ITO), indium doped zinc oxide (IZO), aluminum doped zinc oxide (AZO), boron doped zinc oxide (BZO), gallium doped zinc oxide (GZO), or zinc oxide (ZnO). And the metal may be aluminum (Al), nickel (Ni), gold (Au), silver (Ag), chromium (Cr), titanium (Ti), or palladium (Pd).

The thin film solar cell module and the manufacturing method thereof can increase the contact area between the first electrode layer and the second electrode layer at the positive or the negative electrode.

For the absorber layer in the current output region at the positive electrode is removed owing to the disposition of the mask, which is a time saving process, the current (the useless current) is reduced. The heat resulted from the useless current is also reduced. The resistance is therefore reduced to prevent the generation of the heat resulted from the reverse current and the resistance. Therefore, the thin film solar cell module and the manufacturing method thereof provided by the present invention can efficiently reduce the generation of the heat at the positive electrode, which achieves the object to reduce the temperature of the positive electrode and can prevent the defects of the elements of the solar cell resulted from the high temperature. Moreover, since the first electrode layer and the second electrode layer at the positive electrode or the negative electrode are in direct contact with each other, the disposition of the current output element does not need to be very precisely. Accordingly, the present invention overcomes the shortcomings resulted from the poor controllability of disposition of the solder bumps, which not only causes the poor contact between the front electrode layer and the back electrode layer, but also makes the substrate unsightly.

BRIEF DESCRIPTION OF THE DRAWINGS

The invention as well as a preferred mode of use, further objectives and advantages thereof, will best be understood by reference to the following detailed description of an illustrative embodiment when read in conjunction with the accompanying drawings, wherein.

DETAILED DESCRIPTION OF THE INVENTION

Some particular features of the invention will be described in detail for purpose of illustration, and one of ordinary skill in the art can easily understand the advantages and efficacy of the present invention through the disclosure of the specification. It is to be understood that alternative embodiments may be possible for the implement and application of the present invention while numerous variations will be possible to the details disclosed in the specification on the strength of diverse concepts and applications without going outside the scope of the invention as disclosed in the claims.

Figure 1A:
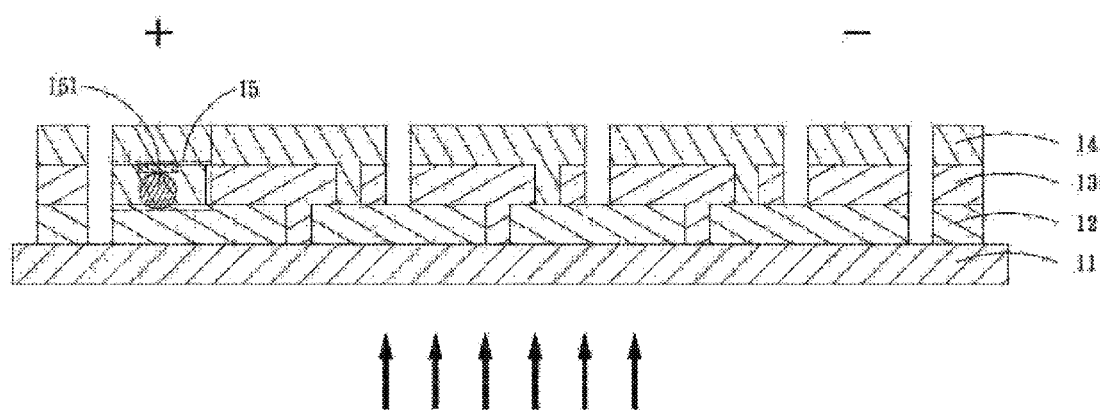
FIG. 1A is a cross-sectional view of the thin film solar cell module according to the first preferred embodiment of the present invention (the arrowhead represents the incident light)

Please refer to FIG. 1A, which is a cross-sectional view of the thin film solar cell module according to the first preferred embodiment of the present invention. The arrowhead represents the incident light. The thin film solar cell module 10 comprises a substrate 11, a first electrode layer 12 formed on the substrate 11, an absorber layer 13 formed on the first electrode layer 12, a second electrode layer 14 formed on the absorber layer 13, and a current output region 15 reserved in the side edge of the absorber layer 13 and formed at the positive electrode of the thin film solar cell module 10. A current output element 151 is disposed in the current output region 15 for outputting a current produced from the absorber layer 13, wherein the current output element 151 is, but not limited to, a soldering tin. Other materials that can electrically conduct a current are also applicable in being the materials of the current output element 151 of this invention.

Additionally, the first electrode layer 12 at the current output region 15 electrically and directly contacts with the second electrode layer 14 at the current output region 15 so as to increase the contact area between the first electrode layer 12 and the second electrode layer 14. Moreover, for the area of the absorber layer 13 in the current output region 15 at the positive electrode is reduced, the current that is generated there by the photovoltaic effect is relatively reduced. The resistance is also reduced. The useless current generated in the current output region 15 is therefore reduced. The heat resulted from the useless current is also reduced. The amount of the heat resulted from the reverse current and the resistance is decreased. Therefore, the generation of the heat at the positive electrode of the thin film solar cell module 10 is reduced, which achieve the object to reduce the temperature of the positive electrode and can prevent the defects of the elements of the thin film solar cell module 10 resulted from the high temperature.

In addition, the current output region 15 can be formed at the negative electrode of the thin film solar cell module 10, thereby making the first electrode layer 12 electrically and directly contact there with the second electrode layer 14 and further increasing the contact area between the first electrode layer 12 and the second electrode layer 14, which results in the elevation of the amount of the electrical current.

Moreover, the present invention provides another thin film solar cell module according to the second preferred embodiment. The second preferred embodiment of the present invention is substantially the same as the first embodiment except the elements described as following. Please refer to FIG. 1B. The thin film solar cell module 10 has the current output region 15, at the same time, formed at the positive electrode of the thin film solar cell module 10 and the negative electrode of the thin film solar cell module 10, respectively. Accordingly, as recited in the above-mentioned second preferred embodiment, the disposition of the current output region 15 at both the positive electrode and the negative electrode of the thin film solar cell module 10 makes the first electrode layer 12 electrically and directly contact there with the second electrode layer 14 and further increasing the contact area between the first electrode layer 12 and the second electrode layer 14, which results in the elevation of the amount of the electrical current at the negative electrode of the thin film solar cell module 10. Besides, the generation of the heat at the positive electrode of the thin film solar cell module 10 is reduced.

Figure 1B:
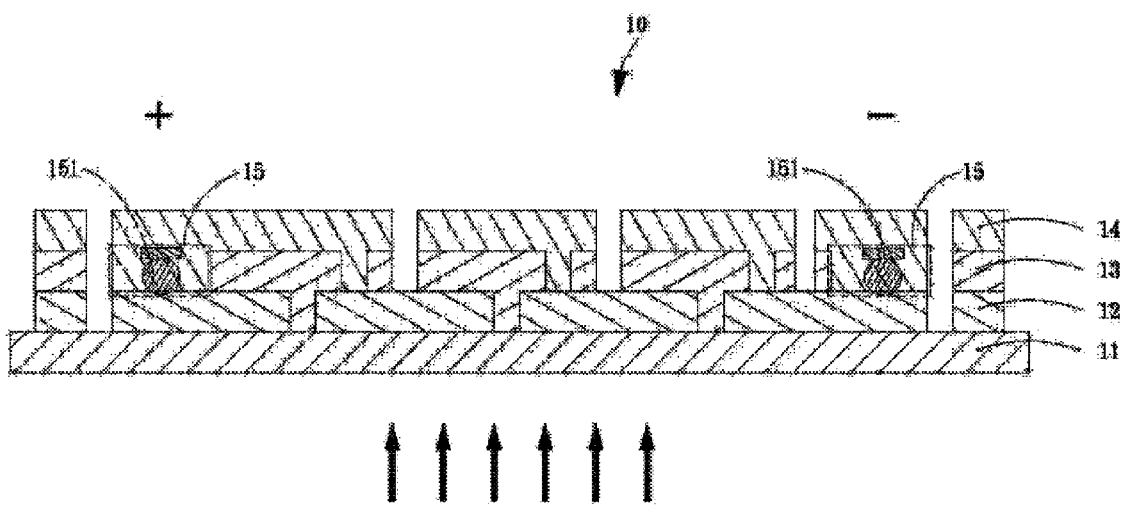
FIG. 1B is a cross-sectional view of the thin film solar cell module according to the second preferred embodiment of the present invention (the arrowhead represents the incident light)

Moreover, since the first electrode layer 12 and the second electrode layer 14 at the positive electrode or the negative electrode are in direct contact with each other, the disposition of the current output element 151 does not need to be very precisely. Particularly, the current output element 15 can be only disposed at the second electrode layer 14 as shown in FIG. 1B and FIG. 1A. Accordingly, the structure of the thin film solar cell module 10 of the preferred embodiments of the present invention can overcome the shortcomings resulted from the poor controllability of disposition of the solder bumps, which not only causes the poor contact between the front electrode layer and the back electrode layer, but also makes the substrate unsightly.

Figure 2:
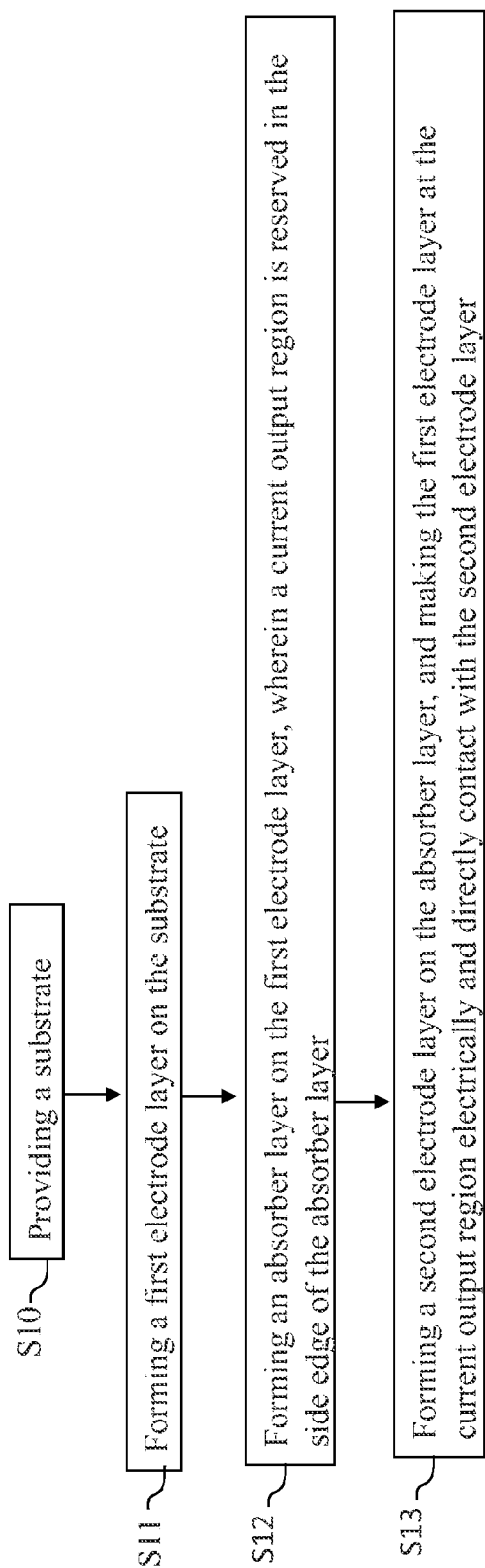
FIG. 2 is a flow chart of the manufacturing method of the thin film solar cell module according to the third preferred embodiment of the present invention.

Please refer to FIG. 2, which is a flow chart of the manufacturing method of the thin film solar cell module according to the third preferred embodiment of the present invention. The manufacturing method of a thin film solar cell module comprises the following steps.

Step S10: Providing a substrate.

Step S11: Forming a first electrode layer on the substrate.

Step S12: Forming an absorber layer on the first electrode layer, wherein a current output region is reserved in the side edge of the absorber layer.

Step S13: Forming a second electrode layer on the absorber layer, and making the first electrode layer at the current output region electrically and directly contact with the second electrode layer.

Furthermore, the manufacturing method of a thin film solar cell module further comprises the steps of disposing a current output element at the current output region. The disposition of the current output element is able to output a current produced from the absorber layer, wherein the current output element can be, but not limited to, a soldering tin, which is one kind of the materials that can electrically conduct a current.

Specifically, the current output region can be formed at the positive electrode, the negative electrode or both the positive electrode and the negative electrode of the thin film solar cell module. The disposition of the current output region may result in the direct contact of the first electrode layer and the second electrode layer at the current output region. The contact area between the first electrode layer and the second electrode layer is therefore increased to reduce the generation of the useless current and the resistance. Both the heat resulted from the useless current and the resistance is also reduced.

The method for the absorber layer being formed on the first electrode layer can be, but not limited to, a deposition process or a sputtering process.

Furthermore, the present invention covers the first electrode layer at the current output region with a mask, wherein the mask inhibit the absorber layer from forming on the first electrode layer at the current output region. Particularly, the above-mentioned mask is designed according to the masking area wanted. Accordingly, the masking effect provided by the above-mentioned mask of the can rapidly remove the absorber layer 13 in the current output region 15, thereby saving the time for manufacturing the thin film solar cell module of the present invention.

In addition, in the thin film solar cell module mentioned previously, the material of the substrate 11 may be soda-lime glass, low iron glass, or alkali-free glass. The material of the absorber layer 13 may be amorphous silicon, polymorphous silicon, microcrystalline silicon (mc-Si) and microcrystalline silicon germanium (mc-SiGe). The material of the first electrode layer 12 may be a transparent conductive oxide. The material of the second electrode layer 14 may be a transparent conductive oxide (TCO), a metal and a metal-transparent-conductive-oxide complex. The transparent conductive oxide may be indium doped tin oxide (ITO), indium doped zinc oxide (IZO), aluminum doped zinc oxide (AZO), boron doped zinc oxide (BZO), gallium doped zinc oxide (GZO), or zinc oxide (ZnO). And the metal may be aluminum (Al), nickel (Ni), gold (Au), silver (Ag), chromium (Cr), titanium (Ti), or palladium (Pd).

Although some particular embodiments of the invention have been described in detail for purposes of illustration, it will be understood by one of ordinary skill in the art that numerous variations will be possible to the disclosed embodiments without going outside the scope of the invention as disclosed in the claims.

What is claimed is:

1. A thin film solar cell module comprising:
   a plurality of serially-connected solar cells disposed on a common substrate, each of the plurality of solar cells individually having:
   a first electrode layer formed on the substrate;
   a light absorbing semiconductor layer formed on the first electrode layer to receive incident light to generate electron-hole pairs by photovoltaic effect;
   a second electrode layer formed on the light absorbing semiconductor layer;
   wherein one of the plurality of solar cells corresponds to a positive electrode of the thin film solar cell module and another one of the plurality of solar cells corresponds to a negative electrode of the thin film solar cell module;
   wherein a side edge of the light absorbing semiconductor layer of the solar cell corresponding to the positive electrode of the thin film solar cell module is provided with a first region and the first electrode layer of the solar cell corresponding to the positive electrode of the thin film solar cell module is directly and electrically contacted with the second electrode layer of the solar cell corresponding to the positive electrode of the thin film solar cell module through the first region;
   wherein a side edge of the light absorbing semiconductor layer of the solar cell corresponding to the negative electrode of the thin film solar cell module is provided with a second region and the first electrode layer of the solar cell corresponding to the negative electrode of the thin film solar cell module is directly and electrically contacted with the second electrode layer of the solar cell corresponding to the negative electrode of the thin film solar cell module through the second region; and
   wherein each of the first region and the second region is disposed with a current output element.

2. The thin film solar cell module according to claim 1, wherein the current output element is a soldering tin.

3. The thin film solar cell module according to claim 1, wherein the substrate is made from a material selected from the group consisting of soda-lime glass, low iron glass, and alkali-free glass.

4. The thin film solar cell module according to claim 1, wherein the light absorbing semiconductor layer is made from a material selected from the group consisting of amorphous silicon, polymorphous silicon, microcrystalline silicon (mc-Si) and microcrystalline silicon germanium (mc-SiGe).

5. The thin film solar cell module according to claim 1, wherein the first electrode layer is made of a transparent conductive oxide (TCO), selected from the group consisting of indium doped tin oxide (ITO), indium doped zinc oxide (IZO), aluminum doped zinc oxide (AZO), boron doped zinc oxide (BZO), gallium doped zinc oxide (GZO), and zinc oxide (ZnO).

6. The thin film solar cell module according to claim 1, wherein the second electrode layer is made from a material selected from the group consisting of a transparent conductive oxide (TCO), a metal and a metal-transparent-conductive-oxide complex.

7. The thin film solar cell module according to claim 6, wherein the transparent conductive oxide is made from a material selected from the group consisting of indium doped tin oxide (ITO), indium doped zinc oxide (IZO), aluminum doped zinc oxide (AZO), boron doped zinc oxide (BZO), gallium doped zinc oxide (GZO), and zinc oxide (ZnO).

8. The thin film solar cell module according to claim 6, wherein the metal is made from a material selected from the group consisting of aluminum (Al), nickel (Ni), gold (Au), silver (Ag), chromium (Cr), titanium (Ti), and palladium (Pd).

* * * * *